(12) United States Patent
Kikkawa (10) Patent No.: US 6,465,816 B2
(45) Date of Patent: Oct. 15, 2002

(54) SEMICONDUCTOR DEVICE AND MANUFACTURING METHOD OF THE SAME

(75) Inventor: Toshihide Kikkawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/764,114

(22) Filed: Jan. 19, 2001

(65) Prior Publication Data

US 2001/0009279 A1 Jul. 26, 2001

(30) Foreign Application Priority Data

Jan. 21, 2000 (JP) ......................... 2000-013283

(51) Int. Cl.[7] ............................................. H01L 29/778

(52) U.S. Cl. ..................... 257/194; 257/198; 257/201

(58) Field of Search ................................ 257/198, 194, 257/201

(56) References Cited

U.S. PATENT DOCUMENTS 5,856,209 A * 1/1999 Imanishi ..................... 438/172
6,300,558 B1 * 10/2001 Takamoto et al. .......... 136/249

OTHER PUBLICATIONS

Applied Physics Letters, vol. 75, No. 13, Sep. 27, 1999 pp. 1914–1916.

* cited by examiner

Primary Examiner—Jerome Jackson
(74) Attorney, Agent, or Firm—Armstrong, Westerman & Hattori, LLP (57) ABSTRACT

A semiconductor device is a hetero-junction bipolar transistor structured by having a gallium arsenide film among laminated films, which has an indium gallium phosphide (InGaP) film which is connected to the gallium arsenide film and functions as an emitter, wherein the indium gallium phosphide film includes antimony (Sb). By including antimony, a carrier density can be deterred from decreasing near an interface between the gallium arsenide film and the indium gallium phosphide film and an emitter resistance can be reduced to a minimum.

11 Claims, 10 Drawing Sheets

|  | Ree(Ω) | β |
|---|---|---|
| InGaPSb used | 4 | 50 |
| InGaP used | 15 | 80 |

|  | Ron(Ω mm) | Gm(mS/mm) |
|---|---|---|
| InGaPSb used | 0.1 | 650 |
| InGaP used | 0.3 | 550 |

SEMICONDUCTOR DEVICE AND MANUFACTURING METHOD OF THE SAME

BACKGROUND OF THE INVENTION

1. Field of the Invention

This invention relates to a semiconductor device and its manufacturing method, particularly to a compound semiconductor device such as a hetero-junction bipolar transistor (HBT) and a high electron mobility transistor (HEMT).

2. Description of the Related Art

Indium gallium phosphide (InGaP) comes to be used as part of laminated films in recent compound semiconductor devices. Indium gallium phosphide is expected to become a film which replaces aluminum gallium arsenide (AlGaAs) because its reliability in being connected with gallium arsenide can be increased since its lattice constant can be set to be the same as that of gallium arsenide (GaAs), and its characteristic is excellent.

The characteristic of indium gallium phosphide is excellent because of the factors that a deep level called DX center is not formed when indium gallium phosphide is doped with silicon (Si) and that oxygen is hard to be taken in as impurities since it does not include aluminum (Al).

As the compound semiconductor devices using indium gallium phosphide, a HEMT which uses indium gallium phosphide as an electron supplying layer and an HBT which uses indium gallium phosphide as an emitter layer are known.

When indium gallium phosphide is used in the compound semiconductor devices, it is necessary to form layers including arsenide (As) such as gallium arsenide on its upper and lower layers, but it is reported that abnormalities occur under this circumstances at an interface between the layers including indium gallium phosphide and arsenide such as gallium arsenide. The abnormalities are the phenomenon that a carrier is depleted when gallium arsenide is formed on indium gallium phosphide and that carriers are accumulated when indium gallium phosphide is formed on gallium arsenide. This happens when a natural superlattice is formed on indium gallium phosphide. When gallium arsenide without the natural superlattice is formed on indium gallium phosphide with the natural superlattice formed thereon, a distortion occurs at the interface, which causes these abnormalities to occur.

Figure 1:
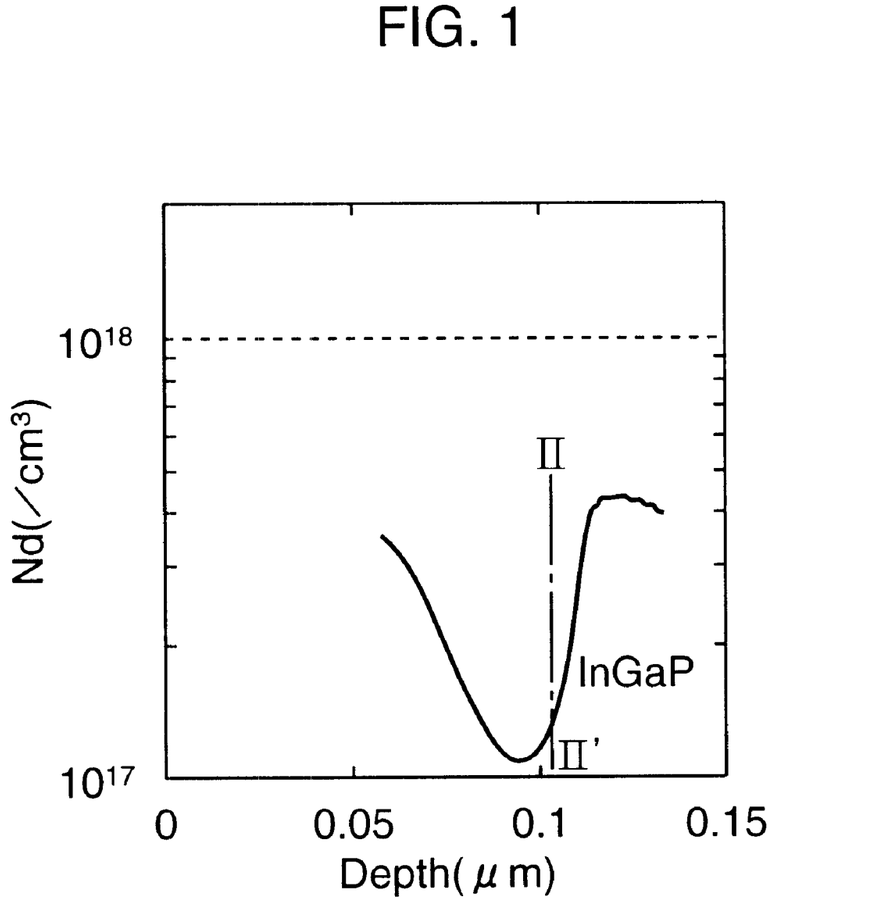
FIG. 1 is a graph showing a carrier profile at an interface between GaAs and InGaP of a conventional compound semiconductor device.

FIG. 1 is a graph showing a carrier density (an n-type electron density) when a gallium arsenide film is formed on an indium gallium phosphide film, in which the axis of ordinates shows the carrier density and the axis of abscissas shows the depth from the surface of the gallium arsenide film. The alternate long and short dash line II–II' shows the position of the interface between the indium gallium phosphide film and the gallium arsenide film. Thus, when the indium gallium phosphide film and the gallium arsenide film are connected, there arises a problem that the carrier is depleted near the interface.

As a result, an electrical resistance is increased when the carrier passes through the interface, which brings about problems such as an ohmic defect, an increased on-resistance, and a Gm dispersion, when the indium gallium phosphide film is used in the HEMT. Further, there arises a problem such as an increase of an emitter resistance when the indium gallium phosphide film is used in the HBT.

SUMMARY OF THE INVENTION

It is an object of the present invention to provide a semiconductor device with increased reliability and its manufacturing method, which is for a compound semiconductor device using an arsenical grown film such as a gallium arsenide film, by preventing carrier depletion near the connecting surface of a thin film which is connected to the grown film.

A semiconductor device according to the present invention comprises an arsenical grown film provided in laminated films, and a thin film directly connected to the grown film. The thin film is an indium gallium phosphide film containing antimony.

Preferably, the thin film forms part of an electron supplying layer of a high electron mobility transistor.

Preferably, the density of antimony in the thin film is within the range of $5 \times 10^{17} cm^{-3}$ to $5 \times 10^{20} cm^{-3}$.

Preferably, the thin film forms part of the emitter layer of a hetero-junction bipolar transistor.

Alternatively, the thin film may form part of the collector layer of the hetero-junction bipolar transistor.

Preferably, the thin film has its composition expressed by $In_xGa_{(1-x)}P_{(1-y)}Sb_y$, where x is within the range of 0.3 to 0.7.

Preferably, the thin film contains aluminum.

Preferably, the thin film is made up from two or more layers, the one of which closest to the grown film contains antimony.

Preferably, the grown film is a gallium arsenide film.

Preferably, the gallium arsenide film contains aluminum.

The present invention is mainly directed to a case wherein the thin film has a natural superlattice structure.

A manufacturing method of the semiconductor device according to the present invention comprises the first step of forming an indium gallium phosphide film containing antimony on a semiconductor substrate, and the second step of forming an arsenical grown film on the indium gallium phosphide film.

Preferably, the grown film is a gallium arsenide film.

Preferably, in the second step, aluminum is introduced into the gallium arsenide film.

The present invention comprises the above-described technical means, thereby deterring a density of n-type impurities from decreasing at the interface between the arsenical grown film such as a gallium arsenide film and the thin film by antimony included in the thin film which is connected to the grown film. As a result, an electrical connection between the grown film and the thin film can be excellently secured and a reduction of an on-resistance can be achieved without preventing electrons from moving at the interface.

According to the present invention, in the compound semiconductor device using an arsenical grown film such as a gallium arsenide film, the carrier can be deterred from depleting near the connecting surface of the grown film with another film. Therefore, it is possible to increase the characteristic of the device, as well as to provide the semiconductor device and its manufacturing method, which achieves the low manufacturing cost.

DETAILED DESCRIPTION OF THE PREFERRED EMBODIMENTS

Hereinafter, preferred embodiments according to the present invention will be explained with reference to drawings.

(First Embodiment)

At the beginning, the first embodiment of the present invention will be explained. In the first embodiment, the present invention is applied to a hetero-junction bipolar transistor (HBT).

Figure 2:
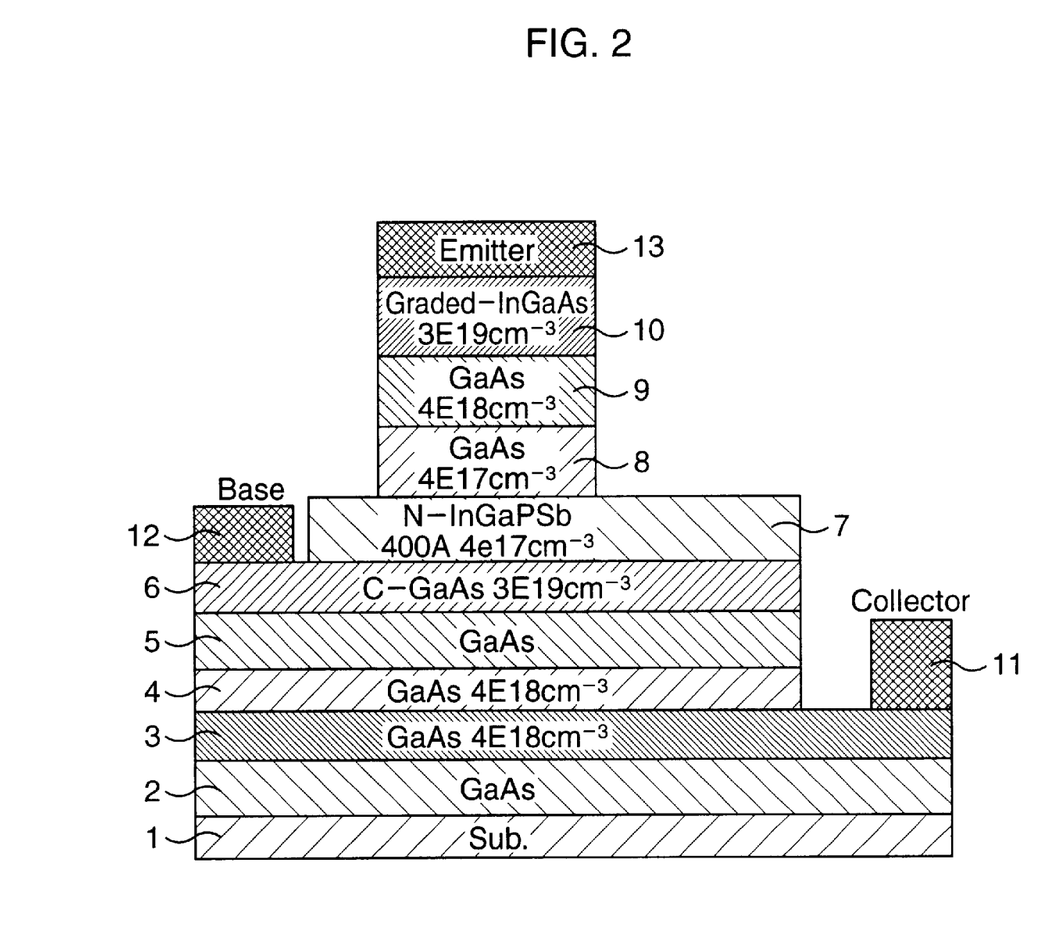
FIG. 2 is a sectional view schematically showing a structure of an HBT according to the first embodiment of the present invention.

FIG. 2 is a sectional view schematically showing the structure of the hetero-junction bipolar transistor according to the first embodiment. As shown in FIG. 2, the bipolar transistor according to this embodiment includes a gallium arsenide (GaAs) film 2 having a film thickness of about $1 \times 10^2$ nm which is laminated on a substrate 1, a gallium arsenide film 3 having a film thickness of about $4 \times 10^2$ nm, and a gallium arsenide film 4 having a film thickness of about $1 \times 10^2$ nm, where the bipolar transistor has an n-p-n structure formed on thus laminated films.

Namely, an n-type gallium arsenide film 5 is formed on the gallium arsenide film 4, which functions as the collector of the bipolar transistor. Further, a carbon-doped gallium arsenide (C—GaAs) film 6 is formed on the gallium arsenide film 5, which functions as the base. An n-type antimony-containing indium gallium phosphide (N—InGaPSb) film 7 is formed on the carbon-doped gallium arsenide film 6, which functions as an emitter. The antimony-containing indium gallium phosphide film 7 has a natural superlattice structure. Here, the film thickness of the gallium arsenide film 5 is set to be about $4 \times 10^2$ nm, the film thickness of the carbon-doped gallium arsenide film 6 is about 70 nm, and the film thickness of the antimony-containing indium gallium phosphide film 7 is about 40 nm.

The gallium arsenide film 5 which functions as the collector is made to be electrically connected to a collector electrode 11 which is formed on the gallium arsenide film 3, through the gallium arsenide films 3 and 4. The collector electrode 11 is a laminated film composed of a gold (Au)-germanium (Ge) alloy, nickel (Ni), gold (Au) or the like.

Incidentally, both of the gallium arsenide films 3 and 4 include n-type impurities at a high concentration of about $4 \times 10^{18}$ cm$^{-3}$ so that the excellent electrical connection between the gallium arsenide film 5 which functions as the collector and the collector electrode 11 is secured.

A base electrode 12 is formed on the carbon-doped gallium arsenide film 6 which functions as the base. The base electrode 12 is a laminated film composed of titanium (Ti), platinum (Pt), gold (Au) or the like.

A gallium arsenide film 8, a gallium arsenide film 9 and an indium gallium arsenide film (Graded-InGaAs) 10 are laminated on the antimony-containing indium gallium phosphide film 7 which functions as the emitter. Here, the film thickness of the gallium arsenide film 8 is set to be about $1.5 \times 10^2$ nm, the film thickness of the gallium arsenide film 9 is about $2.5 \times 10^2$ nm, and the film thickness of the indium gallium arsenide film 10 is about $1.1 \times 10^2$ nm.

Further, an emitter electrode 13 is formed on the indium gallium arsenide film 10. The emitter electrode 13 is made of tungsten silicide (WSi). The gallium arsenide film 8, the gallium arsenide film 9 and the indium gallium arsenide film 10 are the laminated films provided to secure the electrical connection between the antimony-containing indium gallium phosphide film 7 and the emitter electrode 13.

In the hetero-junction bipolar transistor structured as above, by making a potential difference to occur between the emitter and the collector and by applying a predetermined voltage to the base, an emitter-collector current flows, in which the antimony-containing indium gallium phosphide film 7 which functions as the emitter is made possible to prevent a carrier density from decreasing, as it includes a predetermined amount of antimony, particularly at an interface contacting with the gallium arsenide film 8.

Figure 3:
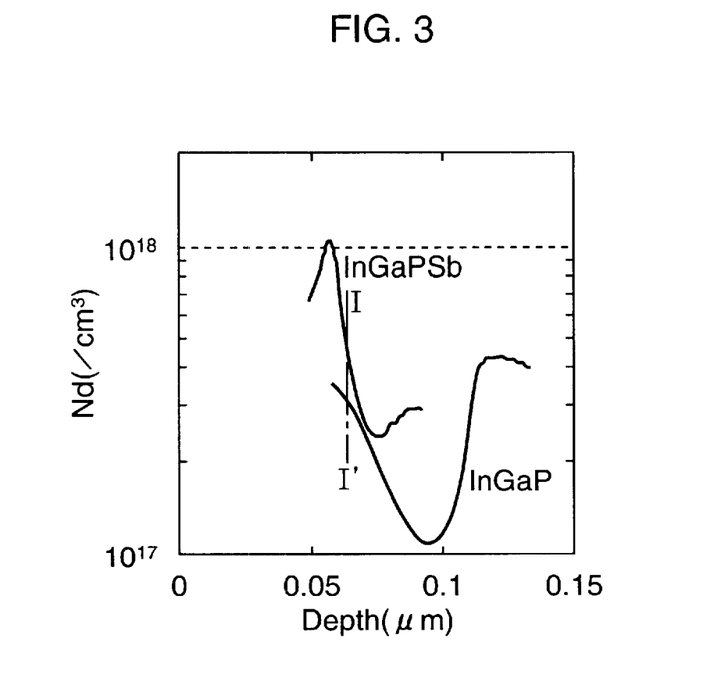
FIG. 3 is a graph showing a carrier profile at an interface between GaAs and InGaPSb.

FIG. 3 is a graph showing the carrier density at the interface between the antimony-containing indium gallium phosphide film 7 and the gallium arsenide film 8, in which the axis of ordinates shows the carrier density and the axis of abscissas shows the depth from the upper surface of the gallium arsenide film 8. The alternate long and short dash line I–I' shows the position of the interface between the antimony-containing indium gallium phosphide film 7 and the gallium arsenide film 8. Further, in FIG. 3, the broken line shows the distribution of the carrier density when the antimony explained in FIG. 1 is not included, which is for the comparative purpose. Thus, the antimony-containing indium gallium phosphide film 7 is formed by including antimony (Sb) in an indium gallium phosphide (InGaP) so that it is made possible to prevent the carrier density from decreasing at the interface with the gallium arsenide film 8 and to maintain the excellent connecting condition therebetween.

Figure 4:
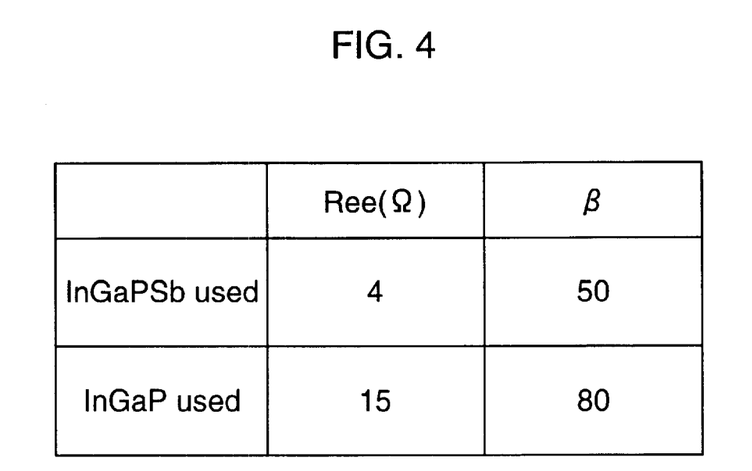
FIG. 4 shows a characteristic of the HBT according to the first embodiment of the present invention.

Thereby, an increase in electrical resistance at the interface, which occurs due to the decrease of the carrier density can be prevented, an emitter resistance can be reduced, and an on-resistance of the transistor can be reduced. In FIG. 4, the results of the reduction of the emitter resistance are compared between the hetero-junction bipolar transistor of FIG. 2 and the hetero-junction bipolar transistor which uses an indium gallium phosphide film not including antimony, instead of the antimony-containing indium gallium phosphide film 7. As shown in FIG. 4, the emitter resistance (Ree) is made possible to be reduced to about one third by including antimony to the emitter.

Figure 5:
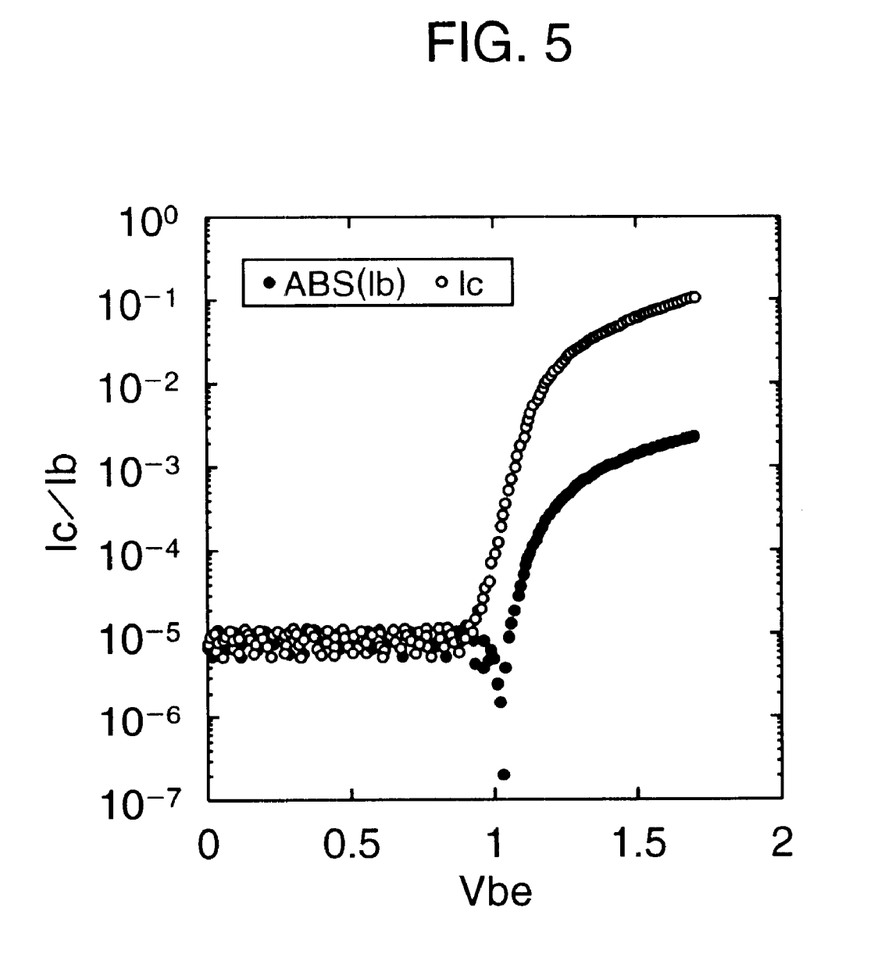
FIG. 5 is a graph showing a gummel plot of the HBT according to the first embodiment of the present invention.

FIG. 5 shows a gummel plot of the hetero-junction bipolar transistor according to this embodiment. Here, β is about 50, but β can be increased to about 100 when the density of antimony included in the antimony-containing indium gallium phosphide film 7 is set to be about $1 \times 10^{19}$ cm$^{-3}$.

Next, a manufacturing method of the hetero-junction bipolar transistor according to the first embodiment will be explained with reference to FIGS. 6A to 6D. FIGS. 6A to 6D are the sectional views schematically showing in sequence the manufacturing method of the hetero-junction bipolar transistor according to the first embodiment.

Figure 6A:
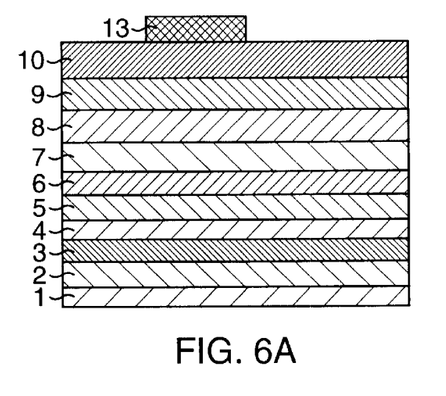
FIGS. 6A to 6D are sectional views showing a manufacturing method of the HBT according to the first embodiment of the present invention.

First, as shown in FIG. 6A, the gallium arsenide film 2, the gallium arsenide film 3, the gallium arsenide film 4, the gallium arsenide film 5, the carbon-doped gallium arsenide film 6, the antimony-containing indium gallium phosphide film 7, the. gallium arsenide film 8, the gallium arsenide film 9 and the indium gallium arsenide film 10 are formed in order on the substrate 1 by means of crystal growth. As a deposition furnace of the crystal growth, a reduced pressure horizontal furnace or the like is used, as a third group material, TMG, TEG, TMI, TMSb or the like are used, and as a fifth group material, $AsH_3$, $PH_3$ or the like are used. Further, as a doping material, $Si_2H_6$ or the like is used. The growth pressure is set to be about 20 hPa to 200 hPa, which is in the condition of the reduced pressure, the growth temperature is set to be 600° C. to 800° C., and as the substrate 1, an off-substrate of 3 inches (100) 2° or the like is used.

More specifically, when the antimony grows including indium gallium phosphide film 7 which functions as the emitter, the growth pressure is set to be about 100 hPa by a metal organic vapor phase epitaxial growth method (MOVPE), $PH_3$ of about 600 cc is supplied at the growth temperature of about 670° C., antimony (Sb) of about 13cc is supplied by trimethyl antimony (TMSb), and antimony of about $1 \times 10^{20}$ $cm^{-3}$ is mixed by operating a hydrogen bubbling at the temperature of about 20° C. Thus, $In_xGa_{(1-x)}PSb$ (x=0.48) in which the lattice of antimony (Sb) is matched to that of gallium arsenide (GaAs) is formed as the antimony-containing indium gallium phosphide film 7. Preferably, an x-composition of $In_xGa_{(1-x)}P_{(1-y)}Sb_y$ is set to be within the limits from 0.3 to 0.7. Thus, the carrier density can be effectively prevented from decreasing near the interface with the gallium arsenide film 8 which is formed on its upper layer.

Figure 7:
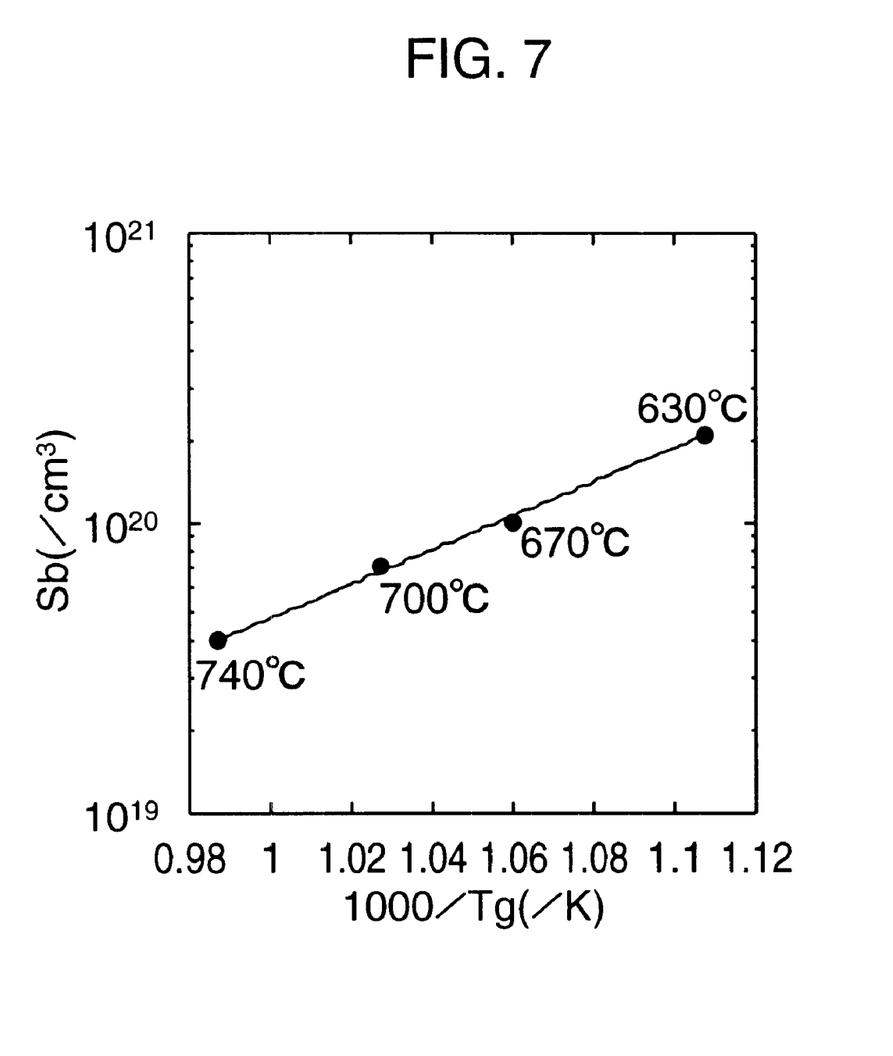
FIG. 7 is a graph showing a result of SIMS assessment concerning the amount of mixed antimony and growth temperature.

FIG. 7 is a graph showing a relationship between the amount of mixed antimony and the growth temperature, in which the axis of ordinates shows the density of antimony and the axis of abscissas shows inverse numbers of the absolute temperature (1/K), and in which the temperature in centigrade (630° C. to 740° C.) is shown in the drawing. As shown in FIG. 7, larger quantities of antimony can be mixed under the lower temperature. Therefore, the antimony-containing indium gallium phosphide film 7 of the desired characteristic can be formed by controlling the temperature in mixing antimony, to thereby controlling its amount. The emitter resistance can be effectively reduced when the density of antimony is set to be within the limits from $5 \times 10^{17}$ $cm^{-3}$ to $5 \times 10^{20}$ $cm^{-3}$, and more preferably, within the limits from $5 \times 10^{18}$ $cm^{-3}$ to $5 \times 10^{20}$ $cm^{-3}$.

After the indium gallium arsenide film 10 is formed by the crystal growth, a tungsten silicide (WSi) film which is a material of the emitter electrode 13 is formed on the gallium arsenide film 10. The tungsten silicide film can be formed by a sputtering process, a CVD method or the like. Subsequently, by means of a photolithography and a dry etching continuous thereto, the tungsten silicide film is patterned itself in a shape of an electrode to form the emitter electrode 13.

Figure 6B:
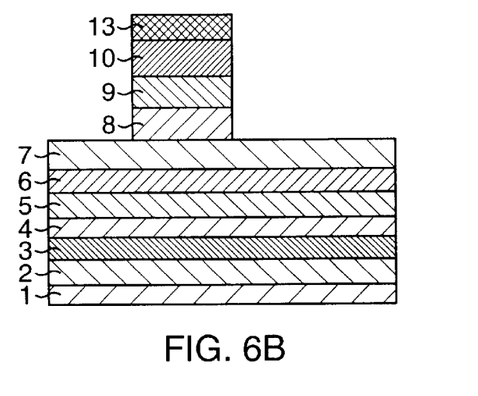

Next, as shown in FIG. 6B, by taking the emitter electrode 13 as a mask, crystal growth films which are the layers overlying the antimony-containing indium gallium phosphide film 7 are removed by means of a wet etching. The etching can be stopped on the antimony-containing indium phosphide film 7 because the etching rates differ between the antimony-containing indium gallium phosphide film 7 and the gallium arsenide film 8.

Figure 6C:
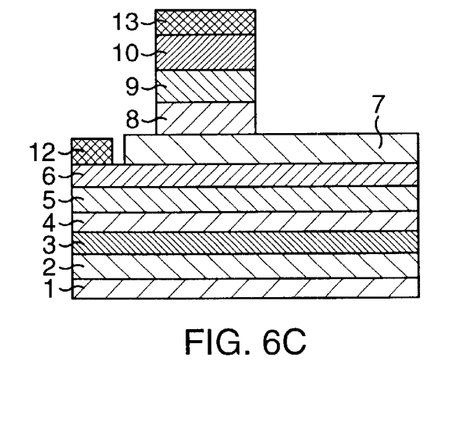

Thereafter, by means of the photolithography and the dry etching continuous thereto, an opening portion is formed on the antimony-containing indium phosphide film 7, which exposes the carbon-doped gallium arsenide film 6 of its lower layer and continuously, by evaporating titanium, platinum and gold in due order, the base electrode 12 which is composed of the laminated film of these metals is formed in the opening portion. Subsequently, a photo resist used for forming the opening portion is removed. Its situation is shown in FIG. 6C.

Figure 6D:
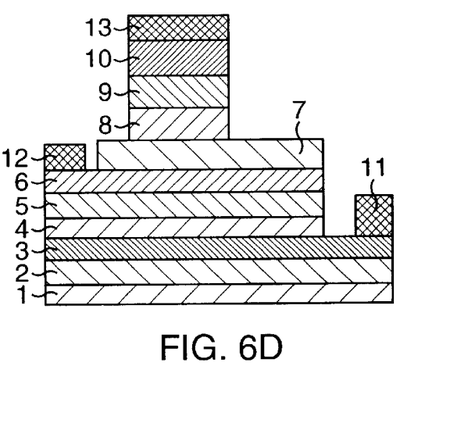

Next, as shown in FIG. 6D, the photo resist of a predetermined shape is formed by photolithography, which is used as a mask to operate the wet etching, and the antimony-containing gallium phosphide film 7, the carbon-doped gallium arsenide film 6, the gallium arsenide film 5 and the gallium arsenide film 4 on the gallium arsenide film 3 are removed. Subsequently, the gallium arsenide film 3 which is exposed by the etching is covered, the photo resist having a predetermined opening portion is formed, and the gold-germanium alloy, nickel, and gold are evaporated so that the collector electrode 11 in which these metals are embedded in its opening portion is formed. Thereafter, the photo resist is removed. Thus, the hetero-junction bipolar transistor according to this embodiment as shown in FIG. 6D is completed.

As described above, according to the first embodiment of the present invention, the antimony-containing indium gallium phosphide film 7 in which antimony is included in the indium gallium phosphide film is used as the film which functions as the emitter of the hetero-junction bipolar transistor so that an n-type electron density can be prevented from decreasing at the interface with the gallium arsenide film 8 formed thereon. Therefore, the resistance which occurs when the emitter-collector current flows can be reduced and the hetero-junction bipolar transistor with the reduced on-resistance can be structured.

Figure 8:
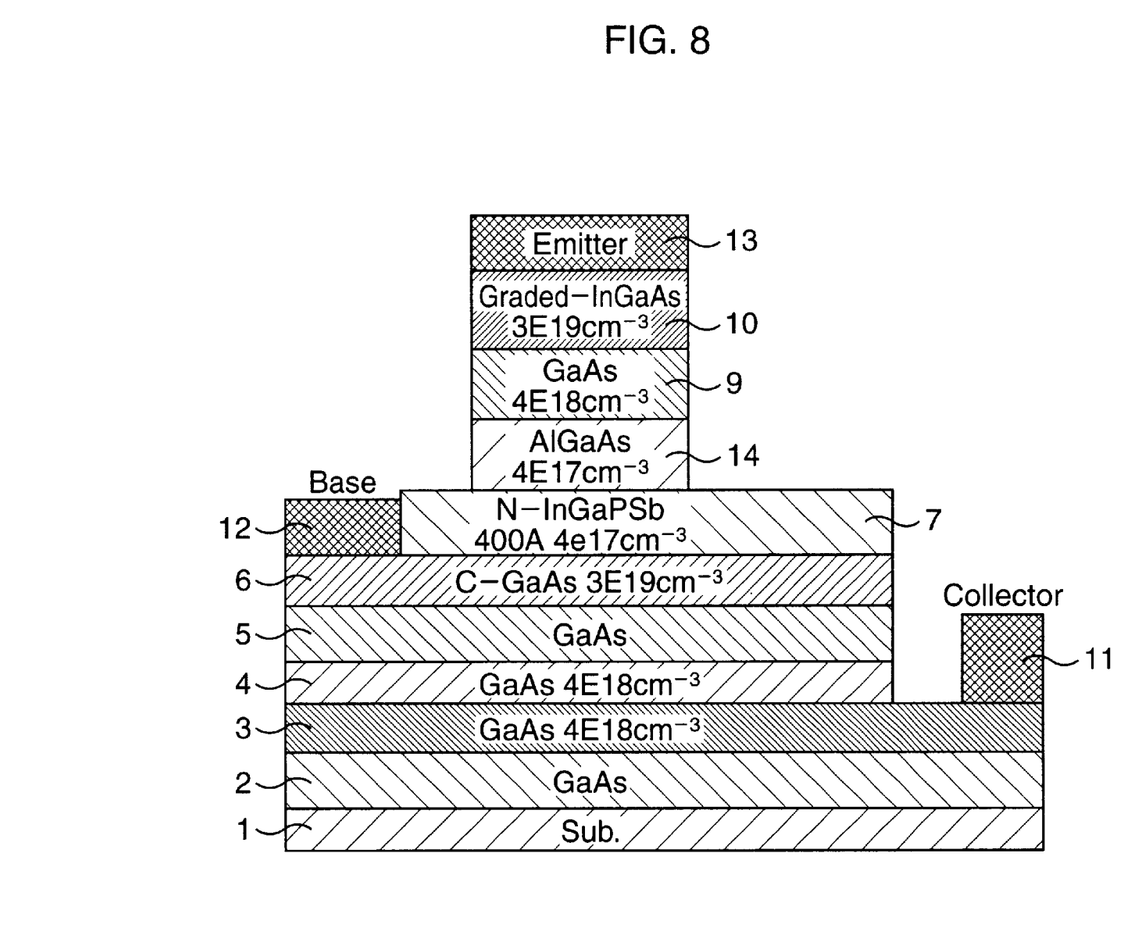
FIG. 8 is a sectional view schematically showing a structure of an HBT according to a modified example of the first embodiment of the present invention.

Next, an example of modification of this embodiment will be explained with reference to FIG. 8. FIG. 8 is a sectional view schematically showing the structure of a hetero-junction bipolar transistor according to the modified example.

In this modified example, an aluminum gallium arsenide (AlGaAs) film 14 is used on the antimony-containing indium gallium phosphide film 7, instead of the gallium arsenide film 8 among the laminated films which compose the hetero-junction bipolar transistor shown in FIG. 2. The other components are the same as those of the first embodiment.

As in this modified example where the aluminum gallium arsenide film 14 is formed on the antimony-containing indium gallium phosphide film 7, the n-type electron density near the interface can be prevented from decreasing, similarly to the first embodiment. Therefore, the resistance which occurs when the emitter-collector current flows can be reduced and the hetero-junction bipolar transistor with the reduced on-resistance can be structured.

(Second Embodiment)

Next, the second embodiment of the present invention will be explained. In the second embodiment, the present invention is applied to a high electron mobility transistor (HEMT).

Figure 9:
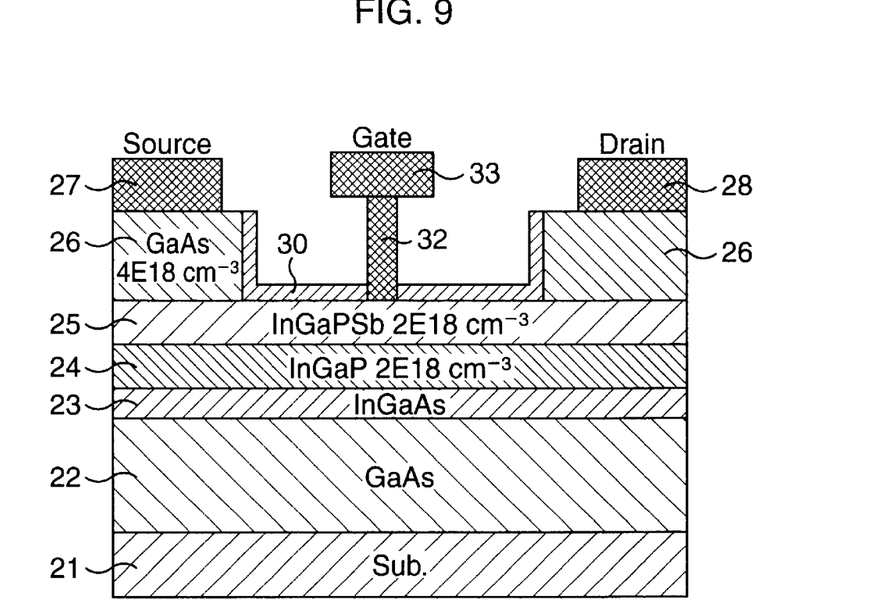
FIG. 9 is a sectional view schematically showing a structure of an HEMT according to the second embodiment of the present invention.

FIG. 9 is a sectional view schematically showing the structure of the high electron mobility transistor according to the second embodiment. As shown in FIG. 9, the high electron mobility transistor according to this embodiment includes a gallium arsenide (GaAs) film 22 having a film thickness of about $6 \times 10^2$ nm which is formed on a substrate 21 and an indium gallium arsenide (InGaAs) film 23 having a film thickness of about 14 nm formed on the gallium arsenide film 22. The indium gallium arsenide film 23 is the film on which channels are formed.

On the indium gallium arsenide film 23, an indium gallium phosphide (InGaP) film 24 and an antimony-containing indium gallium phosphide (InGaPSb) film 25 which function as electron supplying layers are laminated. The antimony-containing indium gallium phosphide film 25 has a natural superlattice structure. The indium gallium phosphide film 24 has a film thickness of about 15 nm and the antimony-containing indium gallium phosphide film 25 has a film thickness of about 10 nm. Both of the indium gallium phosphide film 24 and the antimony-containing indium gallium phosphide film 25 include n-type impurities of about $2 \times 10^{18}$ cm$^{-3}$. Thus, by including antimony (Sb) only in the upper film among the films which function as the electron supplying layers, a two-dimensional electron gas can be prevented from scattering by antimony.

Gallium arsenide films 26 which are spaced out at a predetermined interval are formed on the antimony-containing indium gallium phosphide film 25. A source electrode 27 and a drain electrode 28 are respectively formed on the gallium arsenide films 26.

Between the source electrode 27 and the drain electrode 28, a gate electrode is connected to the antimony-containing indium gallium phosphide film 25. This gate electrode is composed of a lower part made of an aluminum film 32 and an upper part made of an Au film 33. Further, a silicon nitride film 30 is formed on the antimony-containing indium gallium phosphide film 25 except for the area where the lower layers of the gallium arsenide films 26 are provided.

In the high electron mobility transistor (HEMT) as structured as above, by applying a predetermined voltage to the gate electrode, electrons are supplied from the indium gallium phosphide film 24 and the antimony-containing indium gallium phosphide film 25 which function as the electron supplying layers to the indium gallium arsenide film 23, and the channels are formed on the indium gallium arsenide film 23. Further, by making a predetermined potential difference to occur between the source electrode 27 and the drain electrode 28, the electrons move along the channels formed on the indium gallium arsenide film 23, to cause a current to flow between the source electrode 27 and the drain electrode 28. The on-resistance can be effectively reduced by making the density of antimony to be within the limits from $5 \times 10^{17}$ cm$^{-3}$ to $5 \times 10^{20}$ cm$^{-3}$.

Further, at the interface between the gallium arsenide film 26 and the antimony-containing indium gallium phosphide film 25 as the electron supplying layer, the n-type electron density near the interface is prevented from decreasing because antimony is included in the electron supplying layer side. Therefore, the electrical resistance which occurs when the electrodes move between the source electrode 27 and the drain electrode 28 can be reduced to a minimum so that the on-resistance can be reduced.

Figure 10:
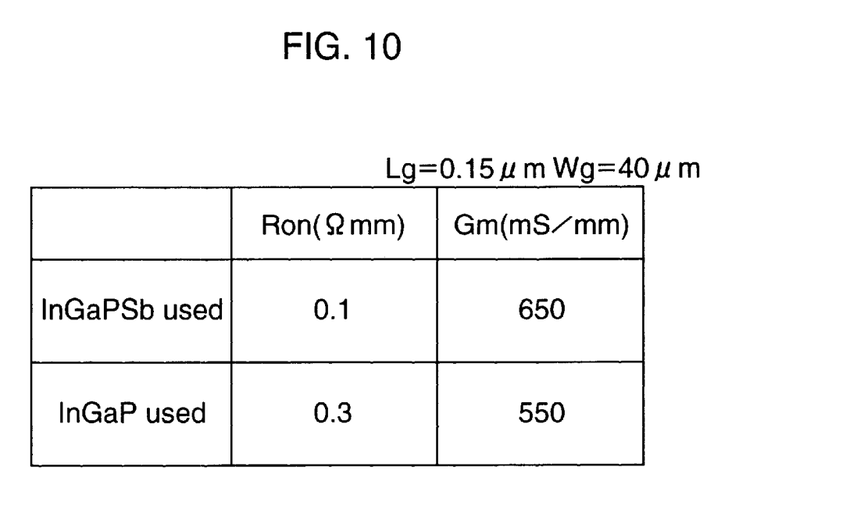
FIG. 10 shows a characteristic of the HEMT according to the second embodiment of the present invention.

FIG. 10 shows the characteristic of the high electron mobility transistor according to the second embodiment. In FIG. 10, the characteristics are shown to compare between the high electron mobility transistor which uses the antimony-containing indium gallium phosphide film 25 according to this embodiment and the high electron mobility transistor which uses a general indium gallium phosphide, instead of the antimony-containing indium gallium phosphide film 25. Thus, the on-resistance can be reduced by including antimony. As a result, Gm can be improved. Moreover, a dispersion of the Gm can be annihilated because the antimony-containing indium gallium phosphide faces a recess surface.

Next, a manufacturing method of the high electron mobility transistor according to the second embodiment is explained with reference to FIGS. 11A to 11F. FIGS. 11A to 11F are the sectional views schematically showing in sequence the manufacturing method of the high electron mobility transistor according to the second embodiment.

Figure 11A:
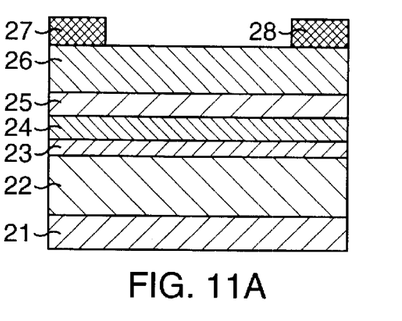
FIGS. 11A to 11F are sectional views schematically showing a manufacturing method of the HEMT according to the second embodiment of the present invention.

First, as shown in FIG. 11A, the gallium arsenide film 22, the indium gallium arsenide film 23, the indium gallium phosphide film 24, the antimony-containing indium gallium phosphide film 25 and the gallium arsenide film 26 are formed in order on the substrate 21 by the crystal growth. The devices and the conditions of the crystal growth are the same as those of the first embodiment.

As in the first embodiment, the amount of antimony included in the antimony-containing indium gallium phosphide film 25 is controllable by controlling the temperature condition and by controlling the supplying amount of antimony.

After the gallium arsenide film 26 is formed by the crystal growth, a tungsten silicide (WSi) film which is a material of the source electrode 27 and the drain electrode 28 is formed on the gallium arsenide film 26. The tungsten silicide film can be formed by a sputtering process, a CVD method or the like. Subsequently, by means of the photolithography and the dry etching continuous thereto, the tungsten silicide film is patterned itself in shapes of the electrodes to form the source electrode 27 and the drain electrode 28. Its situation is shown in FIG. 11A.

Figure 11B:
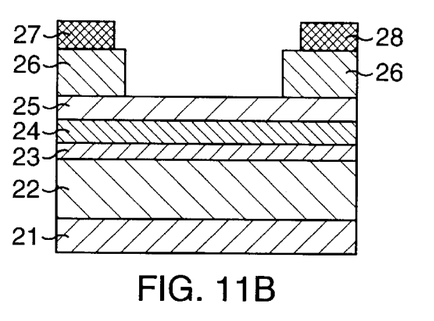

Next, as shown in FIG. 11B, a photo resist of a predetermined shape is formed by photolithography, which is used as a mask to operate etching and by removing the gallium arsenide film 26 between the source electrode 27 and the drain electrode 28, the antimony-containing gallium phosphide film 25 on its lower layer is exposed. Thus the gallium arsenide film 26 is divided.

Figure 11C:
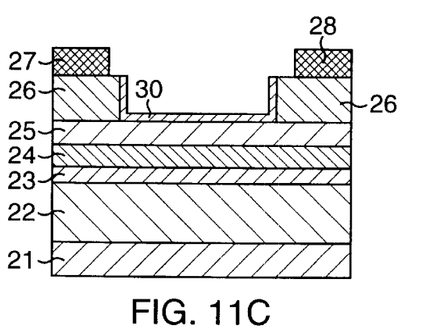

Thereafter, as shown in FIG. 1C, the silicon nitride film 30 is formed in such a manner to cover the exposed portion of the antimony-containing indium gallium phosphide film 25 and the side surfaces of the gallium arsenide films 26. The silicon nitride film 30 can be formed by means of CVD method or the like.

Figure 11D:
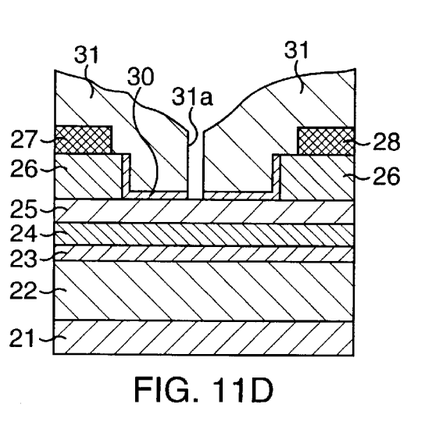

Next, as shown in FIG. 11D, a photo resist 31 having an opening portion 31a is formed between the source electrode 27 and the drain electrode 28 by means of the photolithography, which is used as a mask to operate etching and the antimony-containing gallium phosphide film 25 is exposed by removing the silicon nitride film 30 which is on its lower layer.

Figure 11E:
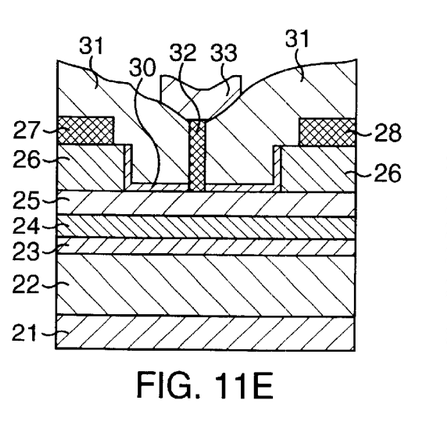

Thereafter, as shown in FIG. 11E, an aluminum film 32 is formed by the evaporation to fill in the opening portion 31a of the photo resist 31. Then, an Au (gold) film 33 is formed by the evaporation again, which is connected to the aluminum film 32.

Figure 11F:
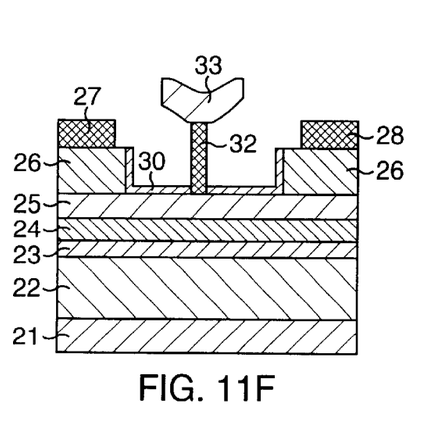

Subsequently, as shown in FIG. 11F, the photo resist 31 is removed by ashing or the like. Thus, the high electron mobility transistor according to the second embodiment is completed.

As described above, according to the second embodiment of the present invention, the carrier density near the interface between the antimony-containing indium gallium phosphide film 25 and the gallium arsenide film 26 can be prevented from decreasing by including antimony to the electron supplying layers of the high electron mobility transistor. Therefore, the on-resistance (Ron) can be reduced as well as the Gm can be improved.

Figure 12:
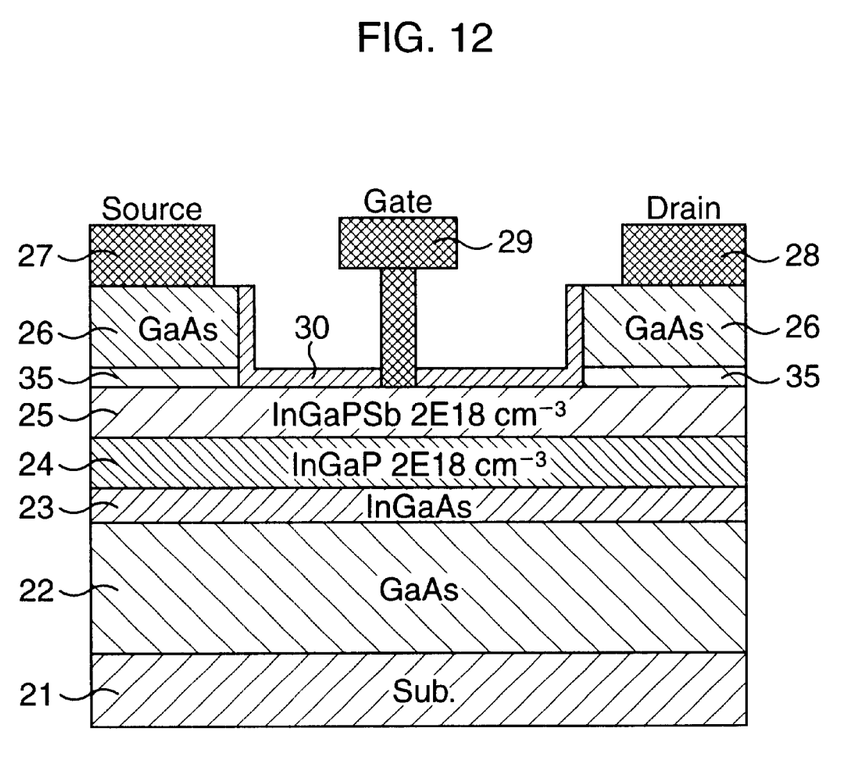
FIG. 12 is a sectional view schematically showing a structure of a HEMT according to a modified example of the second embodiment of the present invention.

Next, an example of modification of this embodiment will be explained with reference to FIG. 12. FIG. 12 is a sectional view schematically showing the structure of a high electron mobility transistor according to the modified example.

In this modified example, an aluminum gallium arsenide (AlGaAs) film 34 is formed between the antimony-containing indium gallium phosphide film 25 and the gallium arsenide films 26, among the laminated films which compose the high electron mobility transistor shown in FIG. 9. The other components are the same as those of the second embodiment.

As in this modified example where the aluminum gallium arsenide film 34 is formed on the antimony-containing indium gallium phosphide film 25 to connect them, the n-type electron density near the interface can be prevented from decreasing, similarly to the second embodiment. Therefore, the resistance by the flowing current which occurs when the channels are formed on the indium gallium arsenide film 23 can be reduced and the high electron mobility transistor with the reduced on-resistance can be structured.

Incidentally, in the aforementioned first and second embodiments, the same characteristic can be obtained where the aluminum is included in the antimony-containing indium gallium phosphide films 7 and 25, which is set to be $In_x(Al_zGa_{(1-z)})_{(1-x)}P_{(1-y)}Sb_y$ (Z=0 to 1), where, for example, x=0.48 and z=0.5.

What is claimed is:

1. A semiconductor device comprising:
   a grown film containing arsenic, said grown film being formed by crystal growth; and
   a thin film that is an indium gallium phosphide film containing antimony, said thin film being directly connected to said grown film.

2. The device according to claim 1, wherein said thin film forms part of an electron supplying layer of a high electron mobility transistor.

3. The device according to claim 1, wherein the density of antimony in said thin film is within the range of $5 \times 10^{17}$ cm$^{-3}$ to $5 \times 10^{20}$ cm$^{-3}$.

4. The device according to claim 1, wherein said thin film forms part of the emitter layer of a hetero-junction bipolar transistor.

5. The device according to claim 1, wherein said thin film forms part of the collector layer of a hetero-junction bipolar transistor.

6. The device according to claim 1, wherein said thin film has its composition expressed by $In_xGa_{(1-x)}P_{(1-y)}Sb_y$, where x is within the range of 0.3 to 0.7.

7. The device according to claim 1, wherein said thin film contains aluminum.

8. The device according to claim 1, wherein said thin film is made up from two or more layers, the one of which closest to said grown film contains antimony.

9. The device according to claim 1, wherein said grown film is a gallium arsenide film.

10. The device according to claim 9, wherein said gallium arsenide film contains aluminum.

11. The device according to claim 1, wherein said thin film has a natural superlattice structure.

* * * * *